United States Patent [19]

Granz

[11] Patent Number: 4,734,611

[45] Date of Patent: Mar. 29, 1988

[54] ULTRASONIC SENSOR

[75] Inventor: Bernd Granz, Oberasbach, Fed. Rep. of Germany

[73] Assignee: Siemens Aktiengesellschaft, Munich, Fed. Rep. of Germany

[21] Appl. No.: 937,840

[22] Filed: Dec. 4, 1986

[30] Foreign Application Priority Data

Dec. 20, 1985 [DE] Fed. Rep. of Germany ....... 3545382

[51] Int. Cl.[4] .............................................. H01L 41/08

[52] U.S. Cl. .................................... 310/324; 310/349; 310/800; 310/334; 310/357

[58] Field of Search ............... 310/334, 336, 337, 324, 310/322, 365, 366, 800, 357–359, 349, 350; 367/157, 160, 161, 163, 164–167

[56] References Cited

U.S. PATENT DOCUMENTS

| | | | |
|---|---|---|---|
| 2,646,610 | 7/1953 | Williams | 310/358 X |
| 3,766,615 | 10/1973 | Shimizu | 310/357 X |
| 3,912,830 | 10/1975 | Murayama et al. | 310/800 X |
| 4,048,526 | 9/1977 | Taylor | 310/800 X |
| 4,079,437 | 3/1978 | Sheffield | 310/800 X |
| 4,413,202 | 11/1983 | Krempl et al. | 310/800 X |
| 4,433,400 | 2/1984 | De Reggi et al. | 310/800 X |
| 4,653,036 | 3/1987 | Harris et al. | 310/800 X |

OTHER PUBLICATIONS

Ultrasonics, 9/1980, Seiten 123–126, Guilford, GB; K. C. Schotton: "A PVDF Membrane Hydrophone for Operation in the Range 0.5 MHz to 15 MHz".

Ultrasonics, 9/1981, Seiten 213–216, Guilford, GB; P.A. Lewin: "Miniature Piezoelectric Polymer Ultrasonic Hydrophone Probes".

Journal of the Acoustic Society of America, Band 63, No. 3, 3/1981, Seiten 853–859, New York, US; De Reggi, "Piezoelectric Polymer Probe for Ultrasonic Applications".

*Primary Examiner*—Mark O. Budd

*Attorney, Agent, or Firm*—Kenyon & Kenyon

[57] ABSTRACT

The invention concerns an ultrasonic sensor (24) in which a polymer foil (4) supported in its peripheral area is piezoelectrically activated at least in a partial section (42). The partial section (42) is electrically coupled to electrodes (8). According to the invention, the electrodes (8), which produce an electrical signal in cooperation with this partial section (42) in response to an ultrasonic wave and are spatially separated from the piezoelectrically active section (42). Because of this feature, the ultrasonic sensor (24) can be used also for measuring ultrasonic shock waves with a high pressure amplitude, since an electrically conductive layer for receiving the electrical signal located on the flat sides of the polymer foil (4) in the piezoelectrically active section (42), is no longer needed.

11 Claims, 7 Drawing Figures

ULTRASONIC SENSOR

BACKGROUND OF THE INVENTION a. Field of Invention

The invention concerns an ultrasonic sensor with a polymer foil fastened to a support structure at least at its peripheral area and which is piezoelectrically activated at least in part which is electrically coupled to electrodes.

b. Description of the Prior Art

Devices known as miniature or membrane hydrophones are used for the determination of the properties of an ultrasonic field existing in a sound-carrying medium, for example water. The three-dimensional distribution of the acoustic pressure amplitude of the ultrasonic field is determined by measuring the acoustic pressure existing in a measuring container at various sites with such a hydrophone.

A miniature hydrophone is known from "Ultrasonics", September 1981, pp. 213 to 216, which comprises piezoelectric polyvinylidene fluoride PVDF foil with a thickness of 25 um (micrometers) and equipped with electrodes on its two flat sides and which is stretched across and electrically insulated from the front end of a refined steel tube. The diameter of the foil is approx. 1 mm. A platinum wire connected to the inner conductor of a coaxial cable is attached on the inside of the foil. This platinum wire is supported by a non-conductive material filling the inside of the refined steel tube. The outside of the foil is in electrical contact with the refined steel tube and connected to the shielding of the coaxial cable.

A membrane hydrophone with a polyvinylidene fluoride PVDF foil with a thickness of 25 um stretched between two metal rings serving as support structures is disclosed in "Ultrasonics", May 1980, pp. 123 to 126. A membrane with an inside diameter of approx. 100 mm is formed thereby. The surfaces of the membrane are equipped with circular disk-shaped electrodes facing each other in a small, central area, and the diameter of the electrodes is 4 mm, for example. The polarized, piezoelectrically active area of the membrane is located between these electrodes. Connecting leads attached in the form of metal films to the surfaces of the membrane lead from the circular disk-shaped electrodes to the edge of the membrane, where they make contact with a coaxial cable through a conductive adhesive.

A significant advantage of these types of hydrophones is that the acoustic impedance of their piezoelectric elements matches better the acoustic impedance of water than with the use of ceramic piezoelectric materials. In comparison to ceramic sensors, an increased width of the frequency band as well as a decrease in the interference with the ultrasonic field at the measuring site results.

But ultrasonic shock waves with high pressure amplitudes in the range approximately $10^8$ Pa cannot be measured with such hydrophones. This type of shock waves with very steep pulse fronts that have rise times below 1 us (microsecond) lead to a mechanical destruction of the metal electrodes attached in the piezoelectrically active area of the PVDF foil of the known hydrophones due to cavitation effects. Such shock waves occur, for example, in the focal area of lithotriptors using a focussed ultrasonic shock wave for the shattering of concretions, for example kidney stones in the kidney of a patient. The properties of the shock wave in the focal area must be determined for the development as well as for the routine monitoring of such devices.

SUMMARY OF THE INVENTION

It is an objective of this invention to devise an ultrasonic sensor that has a piezoelectric element consisting of a polymer and can be used for measuring high energy-level ultrasonic shock waves.

In the present invention, the surface charge vibrations caused by an ultrasonic wave in the piezoelectrically active area of the polymer foil are electrically coupled through the medium surrounding the polymer foil, to the electrodes. The electrodes arranged outside the active surface area of the polymer foil. The piezoelectrically active central section of the polymer foil therefore can be located in the focal area of a focussed ultrasonic shock wave since no mechanically unstable, electrically conductive layer is present.

The invention is based in part on the realization that the use of a piezoelectric polymer with a dielectric constant that is relatively low in contrast to piezoceramic materials allows a purely capacitive coupling without great signal losses. Accordingly, the electrodes can be attached to the foil itself or can be spaced from the foil, on the support structure, spatially separated from the piezoelectrically active section of the polymer foil. The electrodes are then advantageously conformed in such a way that their mutual capacity is as small as possible in contrast to the coupling capacitances, to reduce the signal losses occurring due to parasitic capacitance. One of the electrodes is connected to the electrical ground of the system. Since a high coupling capacity results in a high, electrical effective signal, keeping the coupling capacities to the electrodes as large as possible is advantageous. Since, usually the surroundings of the ultrasonic sensor are approximately at ground potential during measuring, especially the coupling capacity of the piezoelectrically active area with respect to ground can be increased by suitable structural means without the formation of additional signal-reducing parasitic capacitance. In particular, a flat, also membrane-like additional ground electrode can be located in the ultrasonic sensor, facing the piezoelectrically active section of the membrane parallel to its surface. The piezoelectrically active section is particularly effectively coupled capacitively with respect to ground.

In a preferred practical example, cover plates are attached on the free front areas of the supporting structure, facing the two flat sides of the membrane. A tight chamber consequently is formed between the cover plate and membrane, which is filled with a sound-carrying liquid. This offers the advantage that no diffusion occurs between the liquid located inside the chamber and the liquid surrounding the hydrophone. This measure increases the reproducibility of the measurements and also allows the selection of the medium used in the hydrophone independently of the acoustic carrier medium in the measuring container. In an especially advantageous practical example, the liquid contained in the two spaces is an electrolyte.

The polymer foil is polarized by clamping it between movable electrodes connected to high voltage and facing each other. The geometric shape of these electrodes therefore determined the geometric shape of the piezoelectrically active section of the polymer foil.

Electrodes with contact areas equipped with an electrically conductive elastic surface are used to special advantage for the polarization.

BRIEF DESCRIPTION OF THE INVENTION

For a more detailed explanation of the invention, reference is made to the drawings, in which.

DETAILED DESCRIPTION OF THE INVENTION

Figure 1:
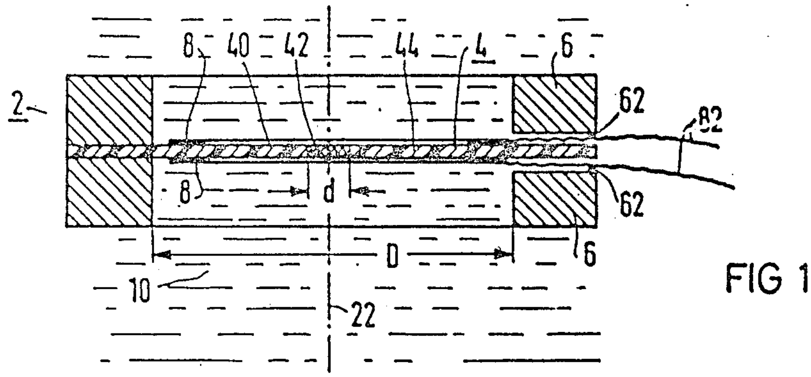
FIG. 1 represents a sectional view of an ultrasonic sensor according to the invention.

As shown in FIG. 1, an ultrasonic sensor 2 comprises a circular disk-shaped polymer foil 4, which is stretched between two ring-shaped support structures 6 and forms a membrane 40. The polymer foil consists of a semicrystalline polymer, such as, for example, polyvinyl fluoride PVF or a copolymer of vinyl fluoride with tetrafluoroethylene or trifluorethyle, such as biaxially extended polyvinylidene fluoride PVDF. The polymer foil is polarized and piezoelectrically active in a central section 42. Piezoelectrically active section 42 is surrounded by a piezoelectrically inactive section 44. The circular disk-shaped, central section is arranged with its center coinciding with axis 22 extending vertically to the flat sides of polymer foil 4. The diameter d of the area 42 is much smaller than the diameter D of membrane 40. For example, the diameter d of polarized central section 42 may be less than 2 mm, and preferably smaller than 1 mm. The diameter D of membrane 40 should be greater than 30 mm, and preferably greater than 50 mm, to reduce the influence of the support structures 6 on the sonic field to be measured in central area 42. The thickness of polymer foil 4 is between 10 um and 50 um. Polymer foil 4 is equipped with electrodes 8 disposed on the two flat surfaces of the piezoelectrically inactive section 44. Electrodes 8 thus are arranged in such a way that they are spatially separated from piezoelectrically active section 42 and do not touch it. Electrodes 8 are located preferably at an outer peripheral area of a polymer foil 4 that have a radial width which is smaller than ¼, and preferably smaller than 1/10 of the diameter of the foil.

Electrodes 8 are preferably ring-shaped and arranged concentrically about center axis 22. Electrodes 8 are equipped with leads 82, which pass in radial grooves 62 through support structures 6, to the cylindrical periphery of ultrasonic sensor 2. The connecting leads 82 can be connected to a coaxial cable, for example, which conducts the electrical signals generated by the sensor to an electronic processing means, such as a charge-sensitive amplifier. One of the two connecting leads 82 may be grounded.

The properties of the ultrasonic field of an ultrasonic radiator used for medical purposes are usually measured in a tube filled with a sound-carrying liquid, for example water. Ultrasonic sensor 2 therefore is typically surrounded by water 10. The pressure forces acting through the ultrasonic field on polymer foil 4 produce high-frequency surface charge vibrations in the piezoelectrically active central area 42. Piezoelectrically active section 42 is electrically separated from electrodes 8 by the high resistivity of pure water. But because of the high relative dielectricity constant $\epsilon_r = 81$ of water, these charge vibrations are capacitively coupled to the electrodes 8 through the water acting as dielectric. Since the signal-receiving electrodes 8 are arranged at the outer edge of the membrane area of polymer foil 4, very high acoustic pressure amplitudes can be measured reproducibly in central section 42 without the danger of a mechanical destruction and a separation of electrodes 8 from polymer foil 4.

Figure 2:
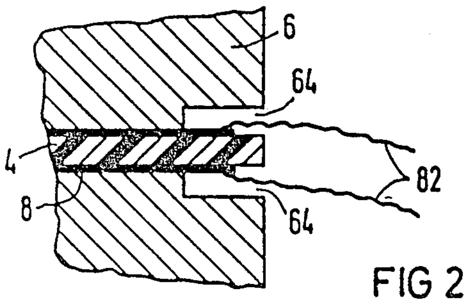
FIG. 2 shows an advantageous configuration of the peripheral area of the ultrasonic sensor, also in a sectional view.

In the embodiment of FIG. 2, electrodes 8 can extend into the area of polymer foil 4 that is engaged support structures 6. Grooves 64, which hold the connecting leads 82, therefore do not need to extend to the inner edge of support structures 6.

Figure 3:
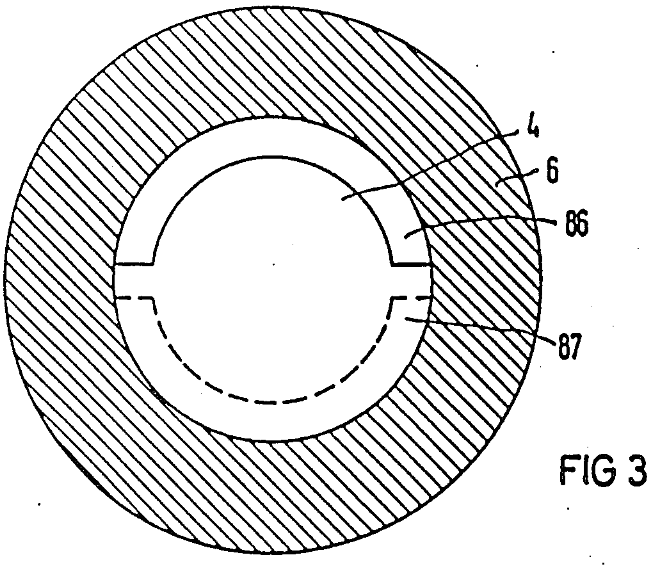
FIG. 3 shows an plan view of electrodes on the flat sides of the polymerfoil.

In the embodiment of FIG. 3, the two flat sides of polymer foil 4 are equipped, respectively, with approximately semicircular electrodes 86 and 87. The two electrodes 86 and 87 are arranged in such a way that they do not overlap. The parasitic capacity occurring between electrodes 86 and 87, which causes a decrease in the electrical effective signal, is thereby reduced. This is especially advantageous when the ultrasonic sensor is used also for the measuring of ultrasonic fields utilized for medical diagnostics.

Figure 4:
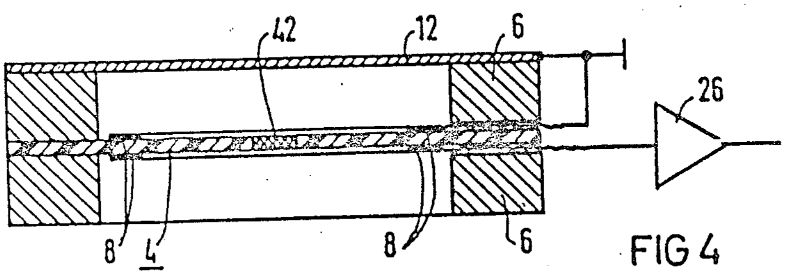
FIG. 4 shows a sectional view of an ultrasonic sensor with a ground electrode.

In the embodiment of FIG. 4, one of the two support structures 6 is equipped with a ground electrode 12 on its flat side opposite polymer foil 4. This ground electrode 12 is grounded together with the electrode 8 disposed between electrode 2 and polymer foil 4. This increases the coupling capacity of piezoelectrically active area 42 with respect to ground and therefore the electrical signal sent to the input of an amplifier 26. Preferably, ground electrode 12 is made of a refined steel foil with a thickness of less than 100 um, and preferably between 10 um and 20 um. Alternatively, the ground electrode 12 may comprise a thin metal grid with a thickness of less than 100 um. The influence of ground electrode 12 on the ultrasonic field is thereby reduced. In another embodiment of the invention, electrode 8 located between ground electrode 12 and polymer foil 4 can be dispsensed since ground electrode 12 replaces electrode 8.

Figure 5:
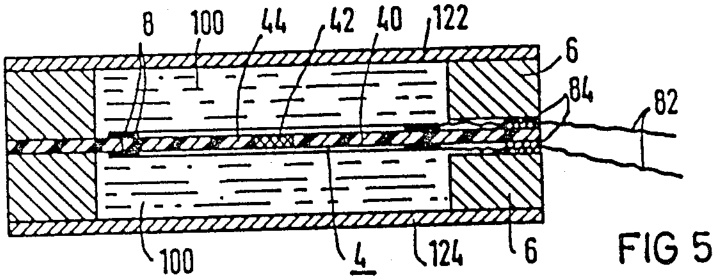
FIG. 5 shows a sectional view of a preferred example of a close ultrasonic sensor.

In the embodiment of FIG. 5, support structures 6 are equipped with a cover plate 122 and 124, respectively, on their flat sides facing away from polymer foil 4. Thus, a tight chamber 100 is formed, between membrane area 40 of the polymer foil 4 and cover plates 122 and 124. These cover plates 122 and 124 may consist of a plastic material, such as polystyrene PS or methylpolymethacrylate PMMA, which is largely acoustically adapted to the sound-carrying liquid located outside chamber 100 and has an insignificant influence on the sonic field to be measured. In an especially preferred embodiment, the cover plates 122 and 124 consist of polymethylpentene, PMP, which has an acoustic impedence almost equal to the acoustic impedence of water. Cover plates 122 and 124 may also consist especially of a polymer foil with a thickness preferably less than 100 um. Chambers 100 are tightly closed against the outer space and are separated by polymer foil 4. For this purpose grooves 62 through which connecting leads 82 are channeled are partly filled in with an adhesive 84, or for the embodiment of FIG. 2 the grooves do not extend to the inner edge of support structures 6. Chambers 100 are filled with a sound-carrying liquid. The liquid may be water, for example, in which the signal coupling from piezoelectrically active central section 42 to contact electrodes 8 occurs largely capacitvely.

Alternatively, chambers 100 may be filled with an electrolyte, and an aqueous solution of table salt, which has an electric conductivity that is chosen to produce an ohmic resistance between electrodes 8 and the surface of piezoactive area 42 of less than 1000 ohms, and preferably less than 100 ohms. In this embodiment, the coupling of the alternating charge signal between the piezoelectrically active section 42 to electrodes 8 occurs in a first approximation through the series resistance produced by the liquid. At least the surface of electrodes 8 preferably is coated with a precious metal, such as gold, Au, or platinum, Pt.

One of the cover plates 122 and 124 can also consist of an electrically conductive material, for example a refined steel foil or an electrically conductive plastic material and can be electrically grounded. This increases the coupling capacitance of piezoelectrically active section 42 ground and the electric output signal is correspondingly increased. When one of the cover plates 122 and 124 consists of a metal material, ultrasonic sensor 2 can be used to advantage for measurements in the sonic field of an ultrasonic radiator by positioning this grounded cover plate on the side of the ultrasonic sensor 2 facing away from the ultrasonic source.

Figure 6:
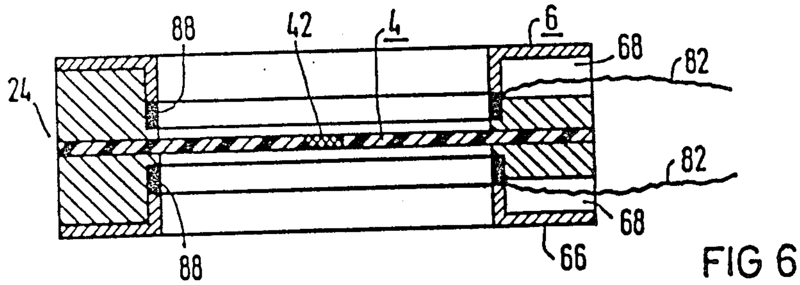
FIG. 6 shows a preferred embodiment of an ultrasonic sensor according to the invention, in which the electrodes are arranged outside the polymer foil.

In the embodiment of FIG. 6, sensor 24 includes a circular disk-shaped polymer foil 4 is attached to a circular symmetrical support structure 6, which is equipped with ring-shaped grooves on its inner wall, that extend to the front areas of support structure 6 facing away from polymer foil 4. Two ring-shaped electrodes 88 are inserted into the grooves and secured by a holding flange 66 attached to support structure 6. The electrodes 88 are, for example, metal rings with a wall thickness of less than 1 mm. The electrodes 88 preferably consist of refined steel or brass, which may have a platinum coating, for example, as protection against the corrosive properties of the surrounding medium. Connecting leads 82 attached to electrodes 88 and extend through grooves 68 of support structure 6 to its cylindrical periphery.

In this embodiment, polymer foil 4 does not overlap electrodes. This offers the advantage that ultrasonic sensor 24 can be considerably reduced in its linear dimensions, since in this example electrodes 88 can be located in the immediate vicinity of the focus of an ultrasonic shock wave without the danger of a destruction of these electrodes 88. Such a miniaturization of ultrasonic sensor 24 has the advantage of increasing the coupling capacities of piezoelectrically active section 42 to electrodes 88 by a decrease of the mutual distance and therefore in viewing the sensitivity of ultrasonic sensor 24.

Ultrasonic sensor 24 in the embodiment of FIG. 6 can also be equipped with a ground electrode as shown in Figure or with cover plates as shown in FIG. 5.

Figure 7:
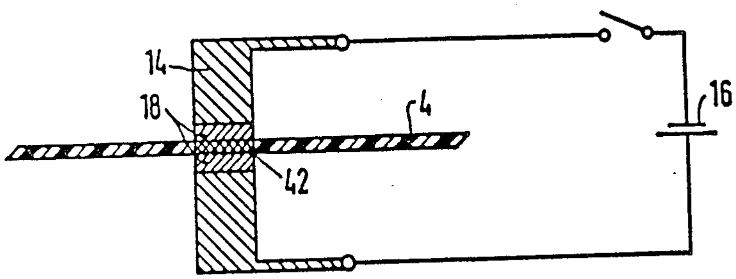
FIG. 7 shows a procedure for the polarization of the polymer foil.

In the embodiment of FIG. 7, a polymer foil 4 is located between two opposed movable electrodes 14 of a high-voltage source 16. Electrodes 14 are attached to polymer foil and at least partially overlap area 42 to be piezoelectrically activated. Depending on the geometric form of the contact areas of electrodes 14, the section 42 of polymer foil 4 is then polarized by applying high voltage 16 and piezoelectrically activated. Consequently, the polarization of section 42 of polymer foil 4 eliminates the need for metal electrodes of geometrically corresponding shape on the membrane. The subsequent procedural steps needed for the activation of polymer foil 4 can be found, in the publication "J. Acoust. Soc. Am." vol. 69, #3, March 1981, page 854.

In an advantageous embodiment of the invention, electrodes 14 may also be equipped at their contact with an electrically conductive elastic pad 18, which consists of a conductive polymer or conductive rubber. Then, polymer foil 4 can be clamped tightly between these elastic pads 18 without the threa of a mechanical destruction of polymer foil 4. This also guarantees that pads 18 contact polymer foil 4 along a maximum contact even when the contact areas of electrodes 14 do not extend exactly parallel to each other. The homogenity of the piezoelectric properties of polarized section 42 can thus be increased.

What is claimed is:

1. An ultrasonic sensor for use in a sound-carrying liquid, comprising:
  - a support structure;
  - a polymer foil at least peripherally attached to said support structure and having piezoelectrically activated section; and
  - electrodes electrically coupled to section, said electrodes being separated from said section by a zone filled with said sound-carrying liquid.

2. The ultrasonic sensor according to claim 1, wherein said foil forms a membrane and the surface of said section is smaller than the area of said membrane.

3. The ultrasonic sensor according to claim 2, wherein said electrodes at least partially overlap the surface area of said membrane.

4. The ultrasonic sensor according to claim 3, wherein said membrane and said section are circular and wherein said electrodes are ring-shaped and are disposed in a region of the membrane and are concentrically about said section.

5. The ultrasonic sensor according to claim 3 wherein said electrodes are arranged on opposite flat sides of said polymer foil and one facing each other, without overlapping.

6. The ultrasonic sensor according to claim 1, wherein said electrodes axially separated from said polymer 7. The ultrasonic sensor according to claim 6, wherein said polymer foil is circular and said electrodes are ring-shaped and are mounted on said support structure.

8. The ultrasonic sensor according to claim 6, further comprising a circular ground electrode disposed in said support structure and facing away from said foil.

9. The ultrasonic sensor according to claim 8, wherein said ground electrode is a metal grid.

10. The ultrasonic sensor according to claim 1, further comprising cover plates located on the ends support structure, opposite said membrane, to form a tight chamber between said cover plates and said membrane, said chamber being filled with a sound-carrying liquid.

11. The ultrasonic sensor according to claim 9, wherein said sound-carrying liquid is an electrolyte.

* * * * *